United States Patent
Sakurai et al.

(10) Patent No.: US 10,486,203 B2
(45) Date of Patent: Nov. 26, 2019

(54) SUBSTRATE PRODUCTION METHOD, SUBSTRATE PROCESSING APPARATUS, AND SUBSTRATE PRODUCTION SYSTEM

(71) Applicant: TOSHIBA MEMORY CORPORATION, Tokyo (JP)

(72) Inventors: Hideaki Sakurai, Kawasaki Kanagawa (JP); Kyo Otsubo, Shinagawa Tokyo (JP); Kenji Masui, Kawasaki Kanagawa (JP); Tetsuo Takemoto, Yokohama Kanagawa (JP); Minako Inukai, Yokohama Kanagawa (JP); Masato Naka, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/253,577

(22) Filed: Aug. 31, 2016

(65) Prior Publication Data
US 2017/0274427 A1 Sep. 28, 2017

(30) Foreign Application Priority Data
Mar. 23, 2016 (JP) .................... 2016-059224

(51) Int. Cl.
- B08B 7/00 (2006.01)
- G03F 7/00 (2006.01)
- B08B 3/10 (2006.01)
- H01L 21/67 (2006.01)
- H01L 21/02 (2006.01)

(52) U.S. Cl.
CPC .......... *B08B 7/0014* (2013.01); *B08B 3/10* (2013.01); *B08B 7/0092* (2013.01); *G03F 7/0002* (2013.01); *H01L 21/02063* (2013.01); *H01L 21/67051* (2013.01); *H01L 21/67057* (2013.01)

(58) Field of Classification Search
None
See application file for complete search history.

(56) References Cited

U.S. PATENT DOCUMENTS 4,962,776 A   10/1990   Liu et al.
6,401,008 B1 *  6/2002   Ehrichs .............. G01N 21/9501
                                                      324/750.18

(Continued)

FOREIGN PATENT DOCUMENTS

JP   H03-503975 A   9/1991
JP   2004-119715 A  4/2004

(Continued)

OTHER PUBLICATIONS

English Machine Translation JP 2017-135201.*
Notification of Reasons for Refusal dated Dec. 14, 2018 in corresponding Japanese Patent Application No. 2016-059224 with English translation, 7 pages.

* cited by examiner

Primary Examiner — Nicole Blan
(74) Attorney, Agent, or Firm — Kim & Stewart LLP

(57) ABSTRACT

A substrate cleaning method includes: steps (a) to (d). In step (a), a liquid is supplied onto a nanoimprint template substrate that has a patterned surface with foreign particles to form a liquid film on the patterned surface. In step (b), the liquid film is solidified to form a solidified film including the foreign particles. In step (c), the substrate is reversed. In step (d), the solidified film is melted to remove the foreign particles.

21 Claims, 18 Drawing Sheets

(56) References Cited

U.S. PATENT DOCUMENTS

| | | | |
|---|---|---|---|
| 7,410,545 B2 | 8/2008 | Matsubara | |
| 8,029,622 B2 | 10/2011 | Miya et al. | |
| 2006/0045722 A1* | 3/2006 | Hashimoto | H01L 21/68707 414/754 |
| 2007/0072423 A1* | 3/2007 | Hensel | C30B 29/06 438/689 |
| 2007/0131246 A1 | 6/2007 | Izumi | |
| 2008/0156351 A1* | 7/2008 | Mitsuyoshi | H01L 21/67201 134/15 |
| 2012/0175819 A1* | 7/2012 | Miya | H01L 21/02052 264/334 |
| 2012/0234364 A1* | 9/2012 | Muramoto | H01L 21/67742 134/104.1 |
| 2013/0020284 A1* | 1/2013 | Osada | H01L 21/67028 216/57 |
| 2014/0101964 A1 | 4/2014 | Sirard et al. | |
| 2014/0237747 A1* | 8/2014 | Torri | D04B 21/04 15/207.2 |
| 2015/0020850 A1* | 1/2015 | Kato | H01L 21/6715 134/4 |
| 2015/0128994 A1 | 5/2015 | Kaneko et al. | |

FOREIGN PATENT DOCUMENTS

| | | | |
|---|---|---|---|
| JP | 2006-332396 | 12/2006 | |
| JP | 2007-165528 A | 6/2007 | |
| JP | 4767138 | 9/2011 | |
| JP | 2014-090167 A | 5/2014 | |
| JP | 2015-119164 A | 6/2015 | |
| JP | 2017135201 A * | 8/2017 | H01L 21/67051 |

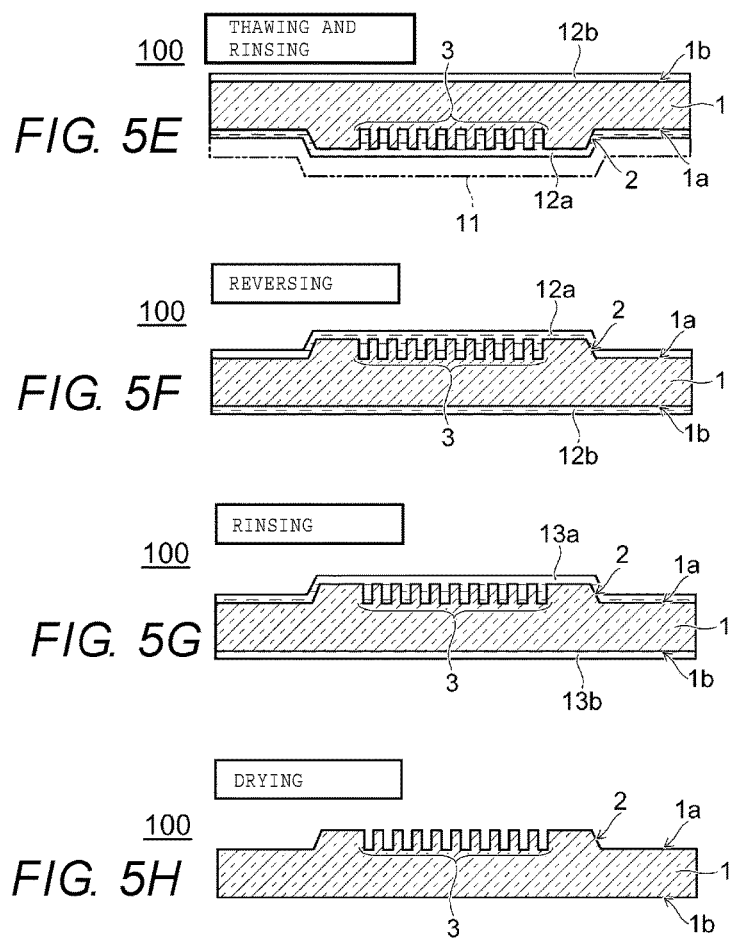

SUBSTRATE PRODUCTION METHOD, SUBSTRATE PROCESSING APPARATUS, AND SUBSTRATE PRODUCTION SYSTEM

CROSS-REFERENCE TO RELATED APPLICATION

This application is based upon and claims the benefit of priority from Japanese Patent Application No. 2016-059224, filed Mar. 23, 2016, the entire contents of which are incorporated herein by reference.

FIELD

Embodiments described herein relate generally to a substrate production method, a substrate processing apparatus, and a substrate production system.

BACKGROUND

Generally, miniaturization of semiconductor devices has progressed. Imprint lithography is a lithography technique for miniaturized semiconductor devices. Imprint lithography uses an imprint lithography template (hereinafter, template) as a transfer original. The template is a substrate, for example a glass substrate. The template is brought into contact with a resist layer formed on a semiconductor wafer or the like. A pattern provided on a patterned surface of the template is transferred onto the resist layer. It is desirable for the patterned surface of the template to have a high cleanliness such that foreign substances such as particles are extremely few and small because the template serves as the transfer original.

DESCRIPTION OF THE DRAWINGS

FIGS. 5A to 5H are schematic sectional views illustrating the substrate production method according to the first embodiment.

DETAILED DESCRIPTION

Figure 1:
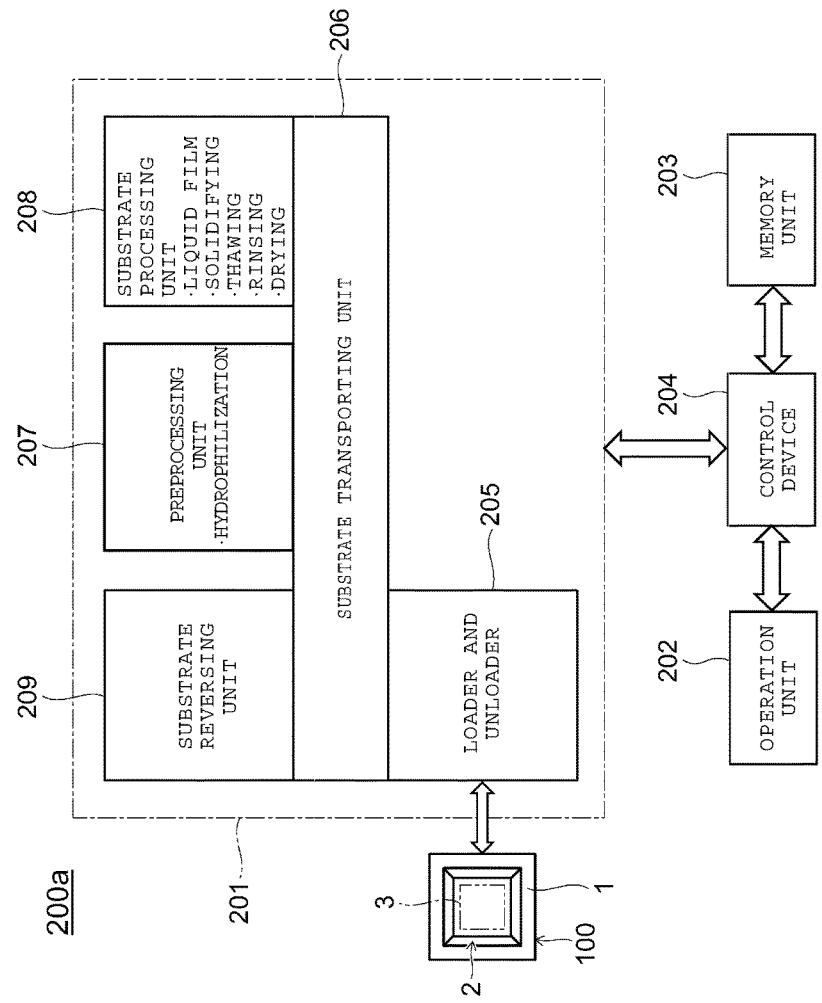
FIG. 1 is a schematic block diagram illustrating a first example of a substrate production system.

Embodiments described herein provide a processing method, a substrate processing apparatus, and a substrate production system that enable the production of a substrate with a patterned surface having a high cleanliness.

In general, according to an embodiment, a substrate cleaning method includes: steps (a) to (d). In step (a), a liquid is supplied onto a nanoimprint template substrate that has a patterned surface with foreign particles to form a liquid film on the patterned surface. In step (b), the liquid film is solidified to form a solidified film including the foreign particles. In step (c), the substrate is reversed. In step (d), the solidified film is melted to remove the foreign particles.

Hereinafter, the embodiments will be described with reference to the drawings. In each of the drawings, the same components will be denoted by the same reference numerals. In the embodiments, a template used in imprint lithography, such as nanoimprint lithography, will be given as an example.

First Embodiment

Substrate Production System

FIG. 1 is a schematic block diagram illustrating a first example of a substrate production system.

As illustrated in FIG. 1, a substrate production system 200a includes a processing unit 201, an operation unit 202, a memory unit 203, and a control device 204.

The processing unit 201 cleans, for example, a template 100 used in nanoimprint lithography. The processing unit 201 includes, for example, a loader and unloader 205, a substrate transporting unit 206, a preprocessing unit 207, a substrate processing unit 208, and a substrate reversing unit 209.

The loader and unloader 205 brings an uncleaned template 100 to the processing unit 201, and brings a cleaned template 100 out from the processing unit 201.

The substrate transporting unit 206 is provided with a transporting device (not illustrated). The substrate transporting unit 206 transports the template 100 in and through the processing unit 201. The preprocessing unit 207 performs preprocessing, for example, hydrophilization processing on the template 100. The substrate processing unit 208 cleans the template 100. The substrate reversing unit 209 reverses the template 100.

In order for an operator to manage the production system 200a, the operation unit 202 includes, for example, a touch panel for receiving an input operation, and a display that visualizes and displays an operation state, and the like. The memory unit 203 stores, for example, control recipes for cleaning the template 100, and the like. The control device 204 includes, for example, a microprocessor. The control device 204 reads a control recipe from the memory unit 203 based on a command from the operation unit 202. The control device 204 controls the processing unit 201 in accordance with the control recipe.

Figure 2:
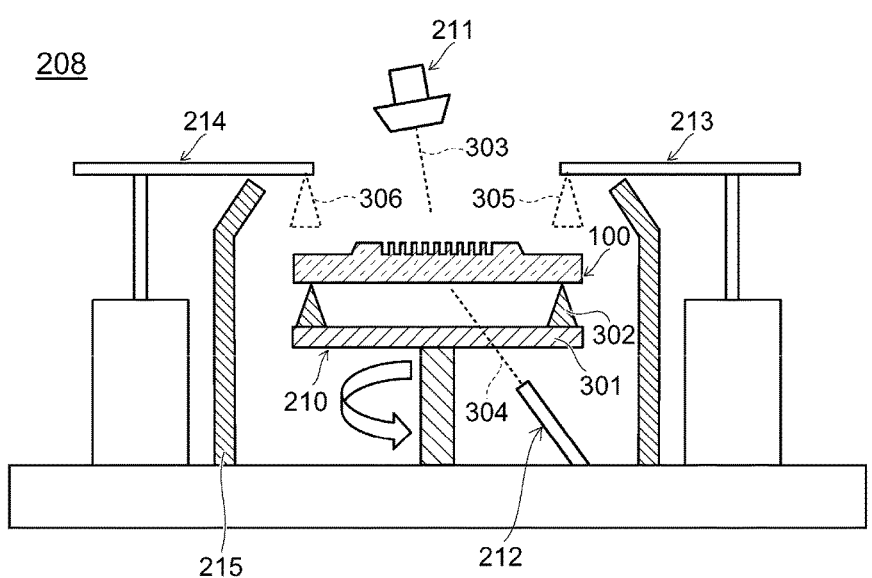
FIG. 2 is a schematic sectional view illustrating an example of a substrate processing unit.

FIG. 2 is a schematic sectional view illustrating an example of the substrate processing unit 208.

As illustrated in FIG. 2, the substrate processing unit 208 includes a holding mechanism 210, a first liquid supplying mechanism 211, a second liquid supplying mechanism 212, a solidifying mechanism 213, a thawing mechanism (melting mechanism) 214, and a treatment cup 215.

The holding mechanism 210 holds the template 100. The holding mechanism 210 is a substrate holding assembly that includes a rotation stage 301 and a holder 302. The rotation stage 301 rotates. The holder 302 is provided on the rotation stage 301. The holder 302 holds the template 100. Accordingly, the holding mechanism 210 holds the template 100 so as to be rotatable.

The first liquid supplying mechanism 211 is a first liquid applicator that supplies a liquid 303 to an upper surface of the template 100 held by the holding mechanism 210. The liquid 303 is, for example, deionized water (DIW). The liquid 303 is used in rinsing the template 100 and in forming a liquid film. The second liquid supplying mechanism 212 is a second liquid applicator that supplies a liquid 304 to a lower surface of the template 100 held by the holding mechanism 210. The liquid 304 is, for example, deionized water (DIW). The liquid 304 is used in the rinsing of the template 100.

The solidifying mechanism 213 solidifies, for example, freezes the liquid film formed on the template 100. The solidifying mechanism 213, which may also be called a solidifier, sprays, for example, a cooled gas 305 onto the template 100 on the holding mechanism 210. The temperature of the cooled gas 305 is equal to or lower than the solidifying point of the liquid film, for example. Accordingly, the liquid film formed on the template 100 becomes a solidified film, for example, an ice film.

The thawing mechanism (melting mechanism) 214 thaws the ice film (solidified film) formed on the template 100. For example, the thawing mechanism 214, which may also be called a liquefier, sprays a gas 306 of which a temperature is adjusted to allow the ice film to thaw onto the template 100 on the holding mechanism 210. The adjusted temperature of the gas 306 is, for example, equal to or higher than the melting point of the ice film. Accordingly, the ice film formed on the template 100 can be melted, for example, thawed.

The solidifying mechanism 213 and the thawing mechanism 214 are used, for example, when cleaning the template 100. Cleaning is, for example, freeze-cleaning.

The treatment cup 215 is provided in the vicinity of the holding mechanism 210. The treatment cup 215 is shaped into a cylinder. The holding mechanism 210 is housed in the treatment cup 215. The treatment cup 215 prevents a liquid on the rotating template 100 from being dispersed. At the same time, the treatment cup 215 recovers a dispersed liquid.

Figure 3A:
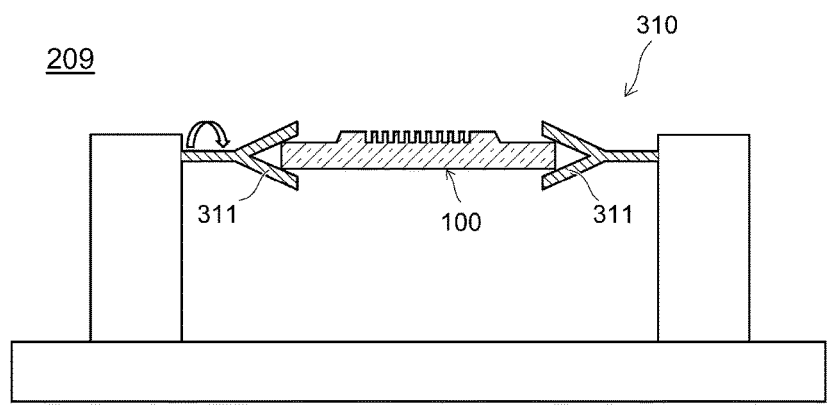
FIGS. 3A and 3B are schematic sectional views illustrating an example of a substrate reversing unit.
Figure 3B:
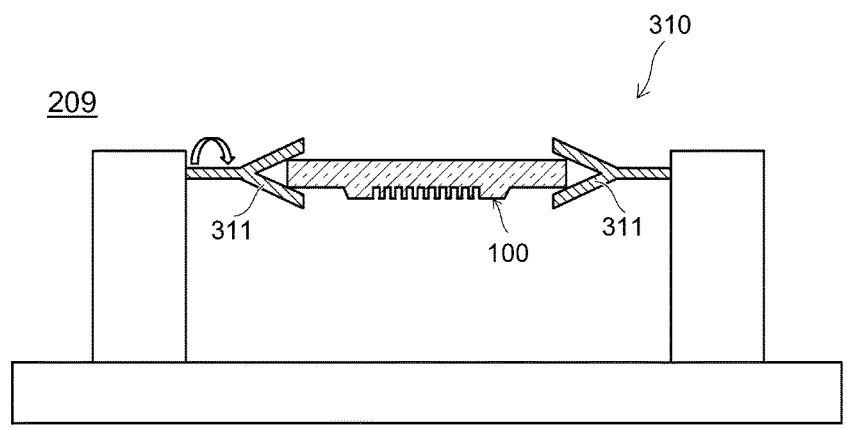

FIGS. 3A and 3B are schematic sectional views illustrating an example of the substrate reversing unit 209.

As illustrated in FIG. 3A, the substrate reversing unit 209 includes a reversing mechanism 310. The reversing mechanism 310 is provided with supporting mechanisms 311 that support opposing side portions of the template 100. As illustrated in FIG. 3B, by the supporting mechanisms 311 being rotated, the reversing mechanism 310 reverses the template 100 supported by the supporting mechanisms 311.

For example, a known unit that performs hydrophilization processing can be used as the preprocessing unit 207. Therefore, specific description thereof will not be provided.

Substrate Production Method

Figure 4:
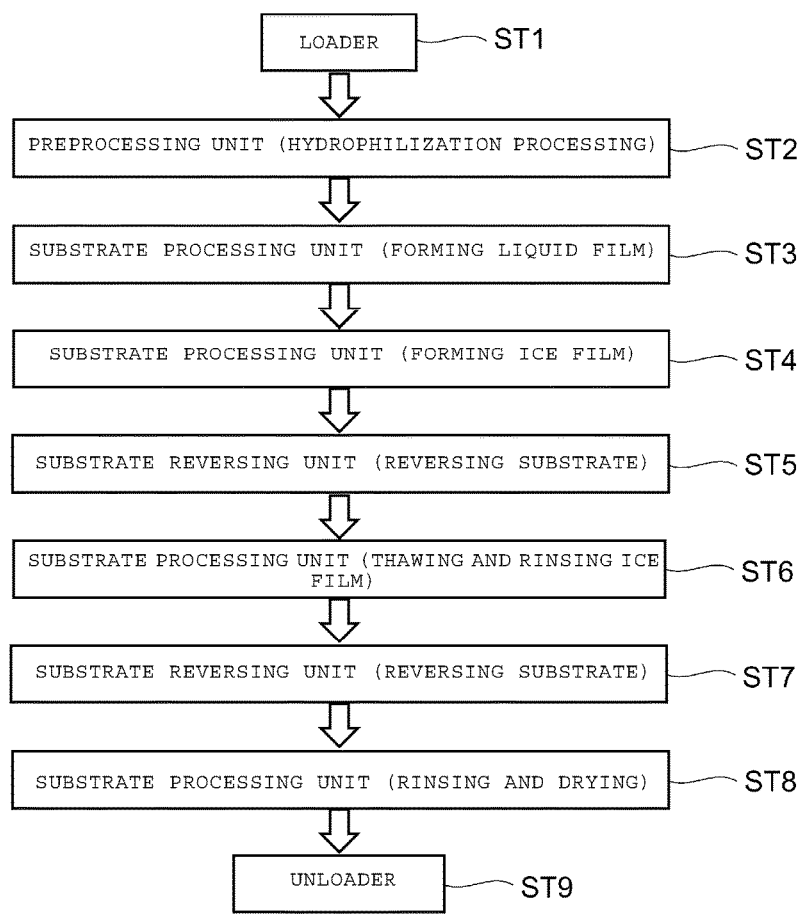
FIG. 4 is a flow chart illustrating a substrate production method according to a first embodiment.

FIG. 4 is a flow chart illustrating an example of a substrate production method according to a first embodiment. FIGS. 5A to 5H are schematic sectional views illustrating an example of the substrate production method according to the first embodiment.

1. Loading

As shown in step ST1 of FIG. 4, the template 100 is brought to the production system 200a via the loader and unloader 205.

2. Hydrophilization Processing

Figure 5A:
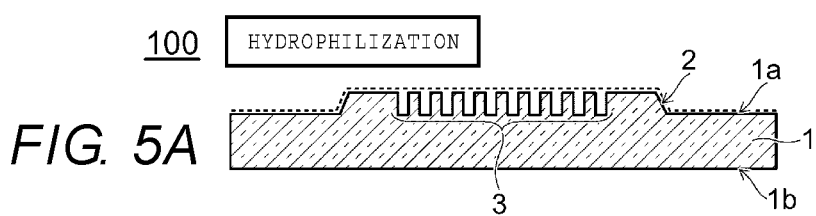

Next, as shown in step ST2 of FIG. 4, the template 100 is brought out from the loader and unloader 205 and is brought to the preprocessing unit 207, using the transporting device of the substrate transporting unit 206. As illustrated in FIG. 5A, the template 100 is hydrophilized in the preprocessing unit 207. The template 100 includes, for example, a quartz substrate 1. A mesa 2 that is a projection portion is provided on a patterned surface 1a of the quartz substrate 1. A patterned region 3 is provided in the mesa 2.

The template 100 is used in the imprint lithography, for example, in the nanoimprint lithography. The template 100 is an "original" in a lithography step of a semiconductor device production process. The patterned region 3 of the template 100 is pressed by, for example, a resist layer on a semiconductor wafer in the lithography step. Accordingly, a pattern corresponding to a pattern provided in the patterned region 3 is transferred, for example, onto the resist layer. The pattern provided in the patterned region 3 corresponds to a wiring pattern or an aperture pattern of the semiconductor device. In the embodiment, for example, a line and space (L/S) pattern is formed. The L/S pattern is, for example, approximately 20 nm in half-pitch, and approximately 40 nm in digging depth. In such an L/S pattern, approximately 80 particles that have a size of 20 nm or smaller, such as a size of approximately 15 nm, may exist per unit area. The hydrophilization is performed, for example, on the patterned surface 1a on which the patterned region 3 is provided. A dashed line in FIG. 5A indicates that the patterned surface 1a is hydrophilized.

3. Forming Liquid Film

Figure 5B:
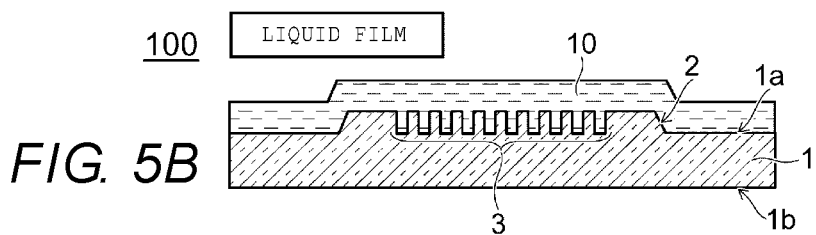

As shown in step ST3 of FIG. 4, the hydrophilized template 100 is brought out from the preprocessing unit 207, and is brought to the substrate processing unit 208, using the transporting device of the substrate transporting unit 206. As illustrated in FIG. 5B, a liquid film 10 is formed on the patterned surface 1a, in the substrate processing unit 208. The liquid film 10 is formed by the liquid 303, for example, DIW being supplied from the first liquid supplying mechanism 211 onto the patterned surface 1a or by a so-called "liquid covering" being performed. After the "liquid covering" is performed, the template 100 is rotated to adjust the thickness of the liquid film 10 to be, for example, approximately 50 nm. The thickness of the liquid film 10 is, for example, equal to or greater than approximately 40 nm, which is the digging depth of the patterned region 3. Accordingly, even the bottoms of concave portions of the patterned region 3 are likely to be filled with the liquid film 10. Without being limited to approximately 50 nm, the thickness of the liquid film 10 may be set differently, for example, to the digging depth of the patterned region 3 or the size of the pitch.

In the embodiment, the patterned surface 1a is hydrophilized in step ST2. Once the patterned surface 1a is hydrophilized, the concave portions of the patterned region 3 are even more likely to be filled with the liquid film 10. In some case, hydrophilization is not necessary depending on the object to be cleaned. For example, if the substrate itself is hydrophilic, hydrophilization is unnecessary.

4. Forming Ice Film

Figure 5C:
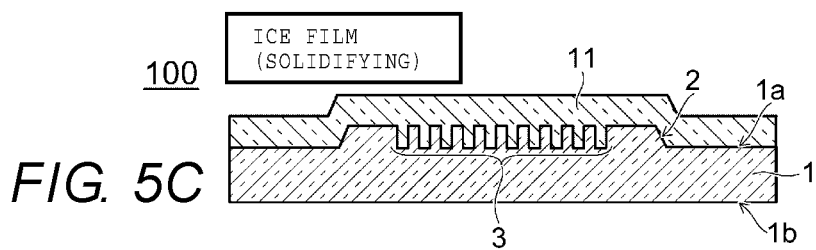

As shown in step ST4 of FIGS. 4 and 5C, an ice film 11 is formed by the liquid film 10 being solidified or, for example, frozen in the substrate processing unit 208. The ice film 11 is formed by the cooled gas 305 being sprayed from the solidifying mechanism 213 onto the liquid film 10. The temperature of the cooled gas 305 is, for example, approximately −50° C. For example, so-called dry air of which humidity is nearly 0% by moisture being eliminated as much as possible is used as the cooled gas 305. Forming the ice film 11 by freezing the liquid film 10 causes minute particles, for example, the particles that have a size of 20 nm or smaller to be attached to the patterned surface 1a to be incorporated into the ice film 11.

5. Reversing Substrate

Figure 5D:
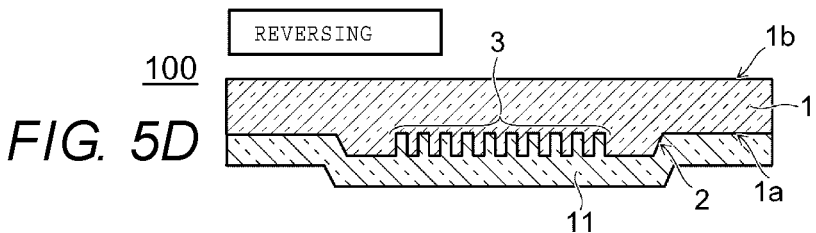

As shown in step ST5 of FIG. 4, the template 100 on which the ice film 11 is formed is brought out from the substrate processing unit 208, and is brought to the substrate reversing unit 209, using the transporting device of the substrate transporting unit 206. As illustrated in FIG. 5D, the template 100 is reversed in the substrate reversing unit 209.

6. Thawing and Rinsing Ice Film

As shown in step ST6 of FIG. 4, the reversed template 100 is brought out from the substrate reversing unit 209, and is brought to the substrate processing unit 208, using the transporting device of the substrate transporting unit 206. As illustrated in FIG. 5E, the ice film 11 thaws in the substrate processing unit 208. When thawing the ice film 11, the gas 306 of which a temperature is adjusted to be equal to or higher than the melting point of the ice film 11 is sprayed from the thawing mechanism 214 into the substrate processing unit 208 while the template 100 is rotated. At the same time, the liquid 304 of which the temperature is adjusted to be equal to or higher than the melting point of the ice film 11, for example, DIW is supplied from the second liquid supplying mechanism 212 onto the ice film 11. The temperature of the liquid 304 is, for example, 4° C. Accordingly, the ice film 11 thaws slowly. Along with the thawing of the ice film 11, the liquid 303, for example, DIW is supplied from the first liquid supplying mechanism 211 onto a rear surface 10b of the template 100 to rinse the rear surface 10b. After the ice film 11 is thawed, the liquid 304, for example, DIW, may continue to be supplied from the second liquid supplying mechanism 212 onto a patterned surface 10a for a rinse duration. Accordingly, the patterned surface 10a is rinsed. In FIG. 5E, reference numerals "12a" and "12b" indicate layers of rinsing liquid.

The thawing of the ice film 11 is not limited to the aforementioned method. The gas 306 or the liquid 304 may be used alone. In addition, the ice film 11 may be thawed naturally.

For example, the particles that have a size of 20 nm or smaller are incorporated into the ice film 11. By thawing the ice film 11 into which the particles that have a size of 20 nm or smaller are incorporated, the particles that have a size of 20 nm or smaller, for example, can be removed from the patterned surface 1a.

For example, it is not easy to remove the particles that have a size of 20 nm or smaller only by rinsing with the liquid 303 and the liquid 304. A cleaning method in which a two-fluid nozzle, ultrasound, and various chemical solutions are combined exists but the method is limited to particles that have a size of approximately 100 nm. If particles are 20 nm or smaller, it is extremely difficult to remove the particles.

In the embodiment, the ice film 11 is thawed by the template 100 being reversed such that the patterned surface 1a faces downward. With the patterned surface 1a facing downward, removing the particles becomes easier compared to a case where the ice film 11 is thawed with the patterned surface 1a facing upward, for example. With the patterned surface 1a facing downward, the particles run down from the thawed ice film 11. Accordingly, the particles from the thawed ice film 11 can be prevented from being attached again to the ice film 11.

7. Reversing Substrate

As shown in step ST7 of FIG. 4, instead of drying the template 100 in which the ice film 11 is thawed, the template 100 is brought out from the substrate processing unit 208, and is brought to the substrate reversing unit 209, using the transporting device of the substrate transporting unit 206. As illustrated in FIG. 5F, the template 100 is reversed in the substrate reversing unit 209.

8. Rinsing and Drying

As shown in step ST8 of FIG. 4, the reversed template 100 is brought out from the substrate reversing unit 209, and is brought to the substrate processing unit 208, using the transporting device of the substrate transporting unit 206. In the substrate processing unit 208, the liquid 303, for example, DIW is supplied from the first liquid supplying mechanism 211 to the patterned surface 10a, and the liquid 304, for example, DIW is supplied from the second liquid supplying mechanism 212 to the rear surface 10b as illustrated in FIG. 5G. Accordingly, the patterned surface 10a and the rear surface 10b are rinsed. In FIG. 5G, reference numerals "13a" and "13b" indicate layers of rinsing liquid. Next, the template 100 is rotated, and the template 100 is dried as illustrated in FIG. 5H.

9. Unloading

As shown in step ST9 of FIG. 4, the dried template 100 is brought out from the substrate processing unit 208, and is brought to the loader and unloader 205, using the transporting device of the substrate transporting unit 206. Next, the template 100 is brought out from the production system 200a via the loader and unloader 205. This concludes description of the substrate production method according to the first embodiment.

In such an embodiment, the liquid film 10 is formed on the patterned surface 1a of the template 100, and the liquid film 10 is solidified, for example, frozen to turn the liquid film 10 into the ice film 11. Afterward, the ice film 11 is thawed. Accordingly, removing, for example, the particles that have a size of 20 nm or smaller from the patterned surface 1a becomes possible whereas the particles are not easily removed with the cleaning method in which a two-fluid nozzle, ultrasound, and various chemical solutions are combined.

For example, approximately 80 particles that have a size of approximately 15 nm may exist per unit area, for example, on the unprocessed patterned surface 1a of the template 100. If the processing in accordance with the embodiment is performed on the patterned surface 1a, the number of particles that have a size of approximately 15 nm can be decreased to 3 per unit area.

As described above, in the embodiment, the substrate production method, the substrate processing apparatus, and the substrate production system that enable the production of a substrate, for example, the template 100 of which the patterned surface 1a has a high cleanliness can be provided.

In the embodiment, the first liquid supplying mechanism 211 and the second liquid supplying mechanism 212 supply DIW as the liquids 303 and 304. Without being limited to DIW as a liquid to be supplied, however, for example, an alkaline solution, an organic solvent, an aqueous surfactant solution, or the like may be used. The change is effective in examples that will be described later.

Production System: Second Example

Figure 6:
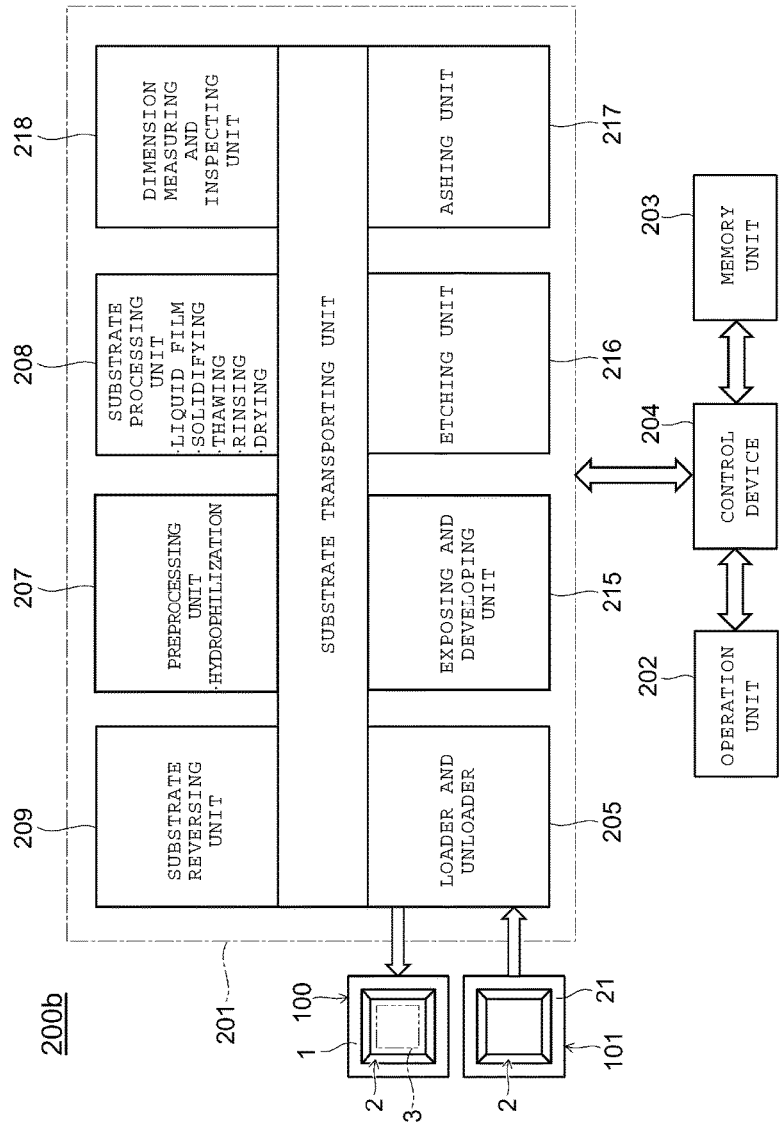
FIG. 6 is a schematic block diagram illustrating a second example of a substrate production system.

FIG. 6 is a schematic block diagram illustrating a second example of the substrate production system.

As illustrated in FIG. 6, a production system 200b of the second example is different from the production system 200a illustrated in FIG. 1 in that the production system 200b further includes an exposing and developing unit 215, an etching unit 216, an ashing unit 217, and a dimension measuring and inspecting unit 218. The production system 200b produces the template 100 from a blank substrate 101.

The exposing and developing unit 215 includes an exposing and developing device, and exposes and develops a resist layer provided on the blank substrate 101, thereby forming a patterned resist. The etching unit 216 includes an etching device, and etches portions of the mesa 2 of the blank substrate 101, using the patterned resist as a mask. The ashing unit 217 includes an ashing device, and performs ashing on the remaining patterned resist. The dimension measuring and inspecting unit 218 includes a dimension measuring and inspecting device, and measures the dimensions of a pattern formed in the patterned region 3 of the template 100 to inspect whether or not the dimensions fall within an allowable range.

Substrate Production Method

Figure 7:
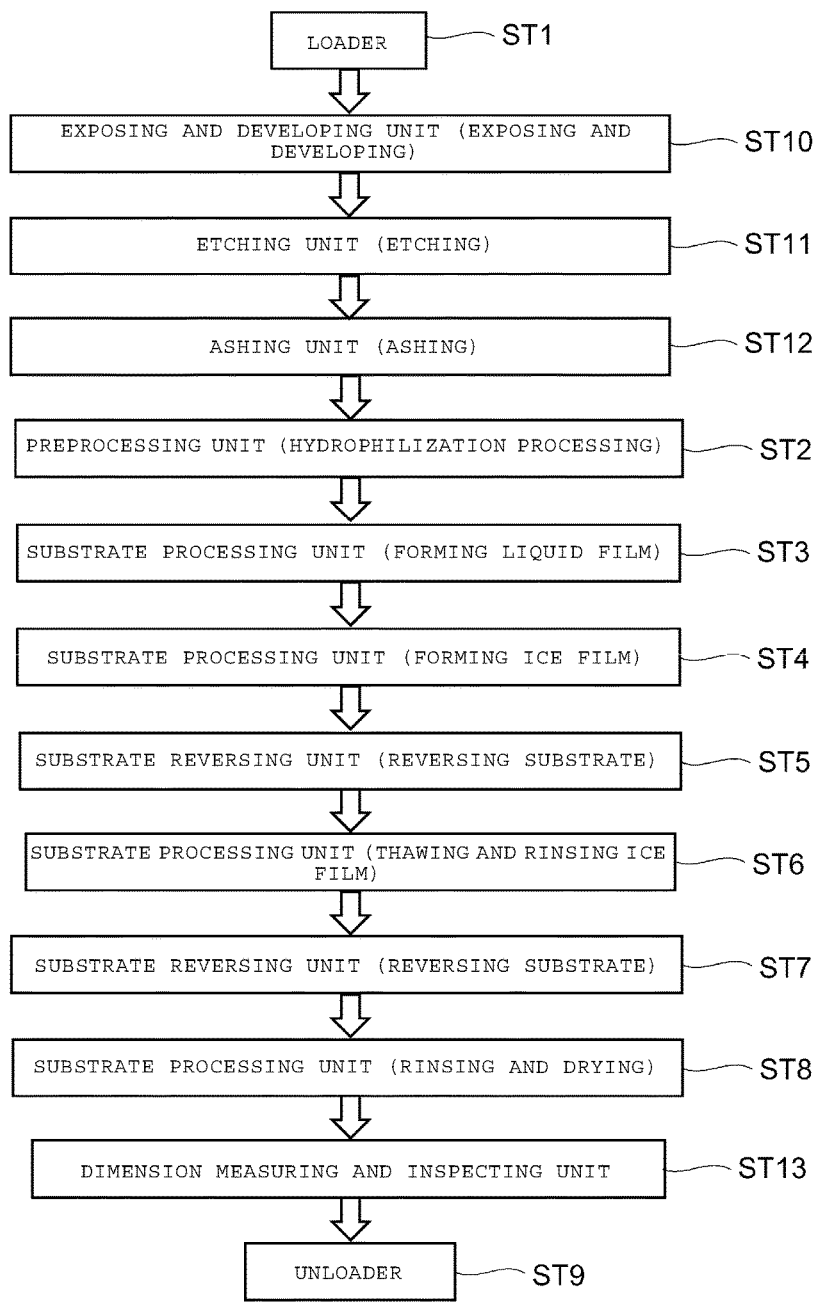
FIG. 7 is a flow chart illustrating an example of the substrate production method in accordance with the substrate production system of the second example.

FIG. 7 is a flow chart illustrating an example of the substrate production method in accordance with the substrate production system of the second example. FIGS. 8A to 8D are schematic sectional views in accordance with the production method of the second example.

1. Loading

As shown in step ST1 of FIG. 7, the blank substrate 101 is brought to the production system 200b via the loader and unloader 205. The blank substrate 101 is, for example, a substrate obtained by a resist layer 21 being provided on a quartz substrate 1. The resist layer 21 is, for example, is an electron beam resist. When processing the quartz substrate 1, the resist layer 21 is used, for example, as an etching mask.

10. Exposing and Developing

Figure 8A:
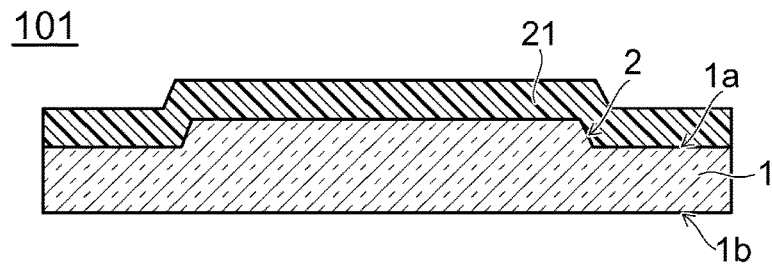
FIGS. 8A to 8D are schematic sectional views in accordance with the substrate production method of the second example.
Figure 8B:
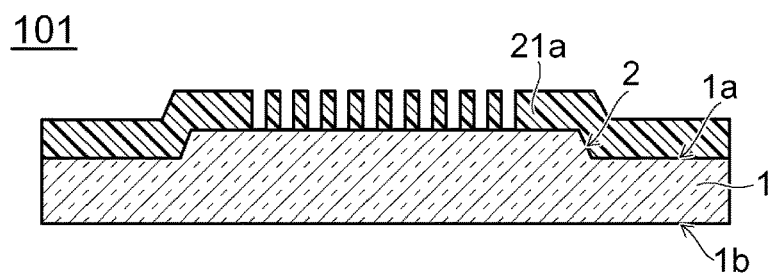

As shown in step ST10 of FIG. 7, the blank substrate 101 is brought out from the loader and unloader 205, and is brought to the exposing and developing unit 215, using the transporting device of the substrate transporting unit 206. In the exposing and developing unit 215, a "pattern" is drawn (=exposed) onto the resist layer 21, using an electron beam lithography device, for example. Next, the drawn resist layer 21 is developed. Accordingly, a patterned resist 21a is formed on the quartz substrate 1 as illustrated in FIG. 8B. A repeating pattern such as the "L/S pattern" included in the patterned resist 21a is formed on the mesa 2.

11. Etching

Figure 8C:
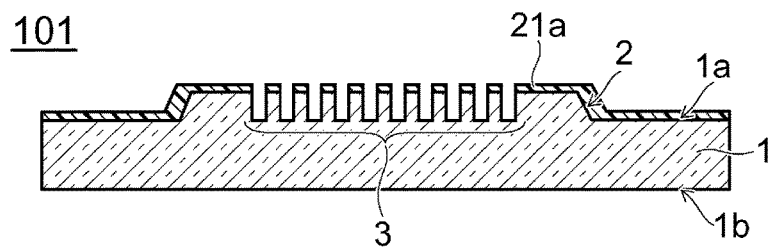

As shown in step ST11 of FIG. 7, the blank substrate 101 of which the patterned resist 21a is formed is brought out from the exposing and developing unit 215, and is brought to the etching unit 216, using the transporting device of the substrate transporting unit 206. In the etching unit 216, the portions of the mesa 2 of the blank substrate 101 are etched, using the patterned resist 21a as the mask, as illustrated in FIG. 8C. Accordingly, the patterned region 3 is formed in the mesa 2.

12. Ashing

Figure 8D:
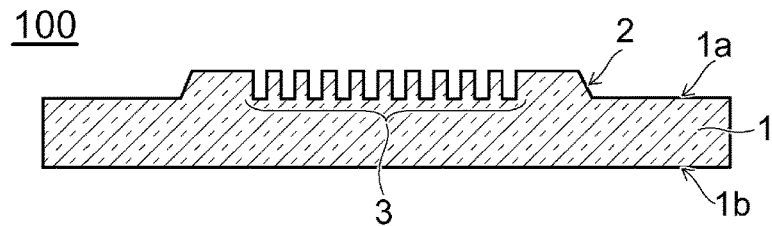

As shown in step ST12 of FIG. 7, the blank substrate 101 in which the patterned region 3 is formed is brought out from the etching unit 216, and is brought to the ashing unit 217, using the transporting device of the substrate transporting unit 206. In the ashing unit 217, ashing is performed on the remaining patterned resist 21a as illustrated in FIG. 8D. Accordingly, the patterned resist 21a is removed from the blank substrate 101. Accordingly, the blank substrate 101 becomes the template 100.

2. Hydrophilization Processing to 8. Rinsing and Drying

As shown in step ST2 of FIG. 7, the template 100 is brought out from the ashing unit 217, and is brought to the preprocessing unit 207, using the transporting device of the substrate transporting unit 206. Afterward, the template 100 is cleaned in accordance with the production method described with reference to FIGS. 4 and 5A to 5H. After the template 100 is brought out from the ashing unit 217, the template 100 may be brought to the preprocessing unit 207 once the template 100 is brought to the substrate processing unit 208 to be rinsed and dried.

13. Measuring Dimension and Inspecting

As shown in step ST13 of FIG. 7, the template 100 is brought out from the substrate processing unit 208, and is brought to the dimension measuring and inspecting unit 218, using the transporting device of the substrate transporting unit 206. In the dimension measuring and inspecting unit 218, the dimensions of the pattern formed in the patterned region 3 are measured to inspect whether or not the dimensions fall within an allowable range.

9. Unloading

As shown in step ST9 of FIG. 7, the inspected template 100 is brought out from the dimension measuring and inspecting unit 218, and is brought to the loader and unloader 205, using the transporting device of the substrate transporting unit 206. Next, the template 100 is brought out from the production system 200b via the loader and unloader 205. This concludes description of the substrate production method in accordance with the substrate production system according to the second example.

In such an embodiment, the template 100 can be produced from the blank substrate 101 while maintaining advantages that are the same as the advantages of the embodiment described with reference to FIG. 1 to FIG. 5H.

Second Embodiment

Substrate Processing Unit

Figure 9:
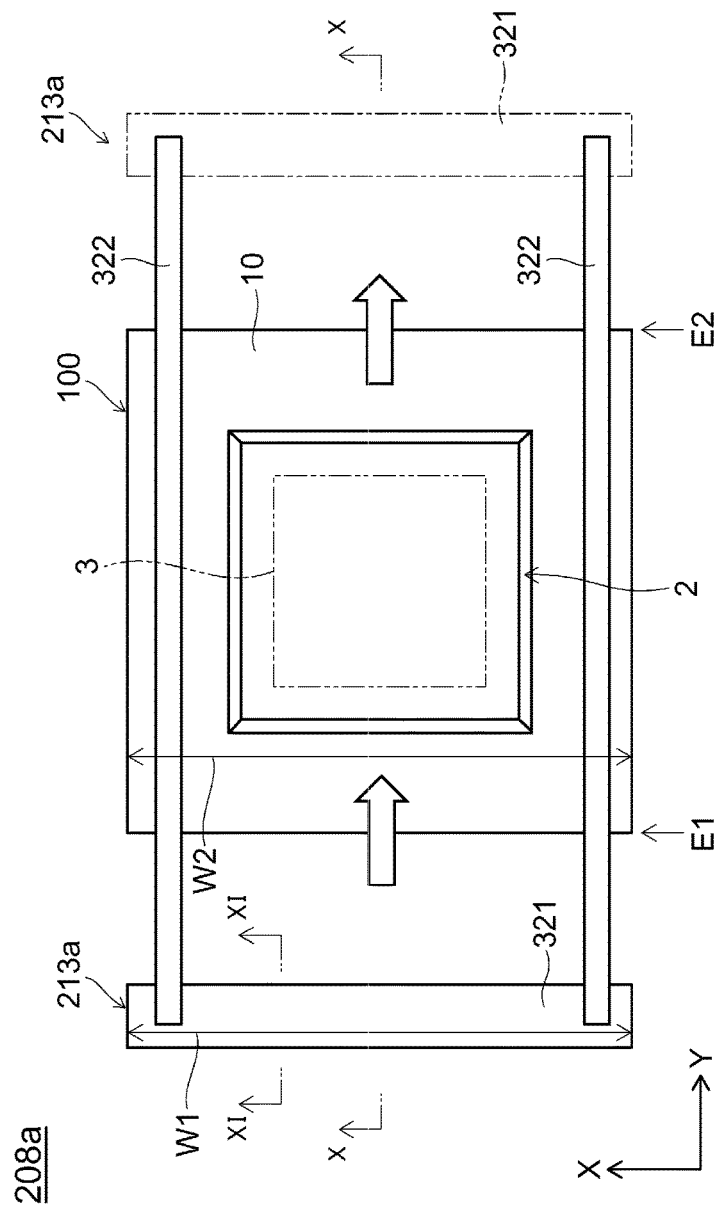
FIG. 9 is a schematic plan view illustrating an example of the substrate processing unit according to a second embodiment.
Figure 10A:
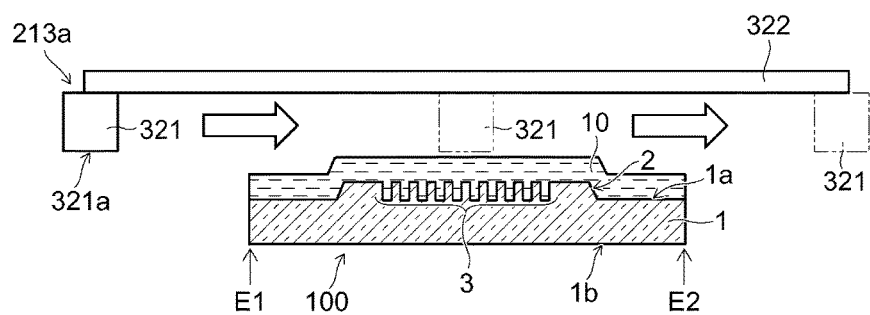
FIG. 10A and FIG. 10B are schematic sectional views taken along line X-X in FIG. 9.
Figure 10B:
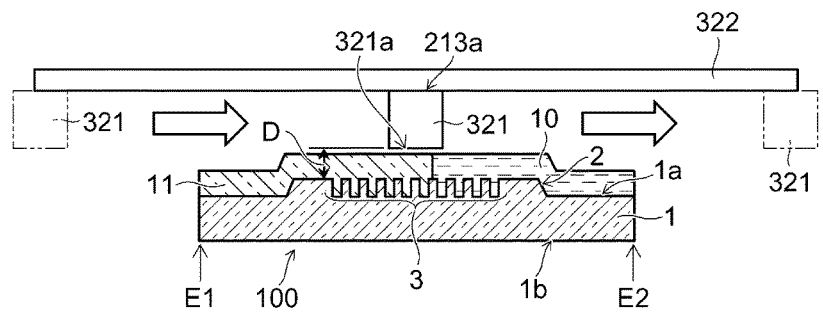
Figure 11:
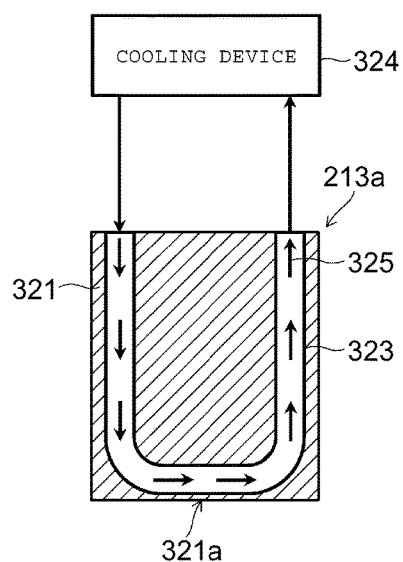
FIG. 11 is a schematic sectional view taken along line XI-XI in FIG. 9.

FIG. 9 is a schematic plan view illustrating an example of the substrate processing unit according to a second embodiment. FIG. 10A and FIG. 10B are schematic sectional views taken along line X-X in FIG. 9. FIG. 11 is a schematic sectional view taken along line XI-XI in FIG. 9. The holding mechanism 210, the first liquid supplying mechanism 211, the second liquid supplying mechanism 212, and the thawing mechanism 214 illustrated in FIG. 2 will not be illustrated in FIGS. 9 to 11.

The substrate processing unit of the second embodiment is different from the substrate processing unit 208 illustrated in FIG. 2 in that the substrate processing unit of the second embodiment has a different solidifying mechanism 213. The solidifying mechanism 213 illustrated in FIG. 2 sprays the cooled gas 305 onto the liquid film 10 and cools the liquid film 10 by "convection" to freeze the liquid film 10.

As illustrated in FIGS. 9 to 11, a solidifying mechanism 213a of a substrate processing unit 208a according to the second embodiment causes a heat absorber 31 to absorb the heat of the liquid film 10, thereby solidifying, for example, freezing the liquid film 10.

The solidifying mechanism 213a includes a movable member 321. The moving mechanism 322, which may be an actuator, moves the movable member 321, for example, as if the movable member 321 scans the facing side of the template 100 held by the holding mechanism 210 (not illustrated). For example, as illustrated in FIG. 10B, when the movable member 321 approaches the facing side of the liquid film 10 on the mesa 2, a distance D between the movable member 321 and the liquid film 10 is, for example, 100 μm to 1,000 μm.

A cooling tube 323 is provided in the movable member 321. The cooling tube 323 is connected to a cooling device 324. A cooled fluid 325 flows in the cooling tube 323. The cooling device 324 cools the fluid 325. The cooled fluid 325, for example, circulates between the cooling tube 323 and the cooling device 324 (refer to FIG. 11). The temperature of the cooled fluid 325 is set to, for example, −40° C. to −80° C. The temperature of the cooled fluid 325 may be set to a different temperature range. The cooled fluid 325 may be a gas, or may be a liquid such as liquid nitrogen. The cooled fluid 325 may be a heat medium, for example, a refrigerant. If the cooled fluid 325 is a refrigerant, the cooling device 324 may be a heat exchanger.

The movable member 321 includes a facing surface 321a. The facing surface 321a faces the template 100. The cooling tube 323 extends along the facing surface 321a. The facing surface 321a is, for example, hydrophobic. The hydrophobic facing surface 321a is made hydrophobic externally or the hydrophobic facing surface 321a is provided with a member made of a hydrophobic material.

The liquid film 10 turns into the ice film 11 as the movable member 321 moves along the facing side of the template 100. A width W1 of the movable member 321 in the X direction is, for example, equal to or larger than a width W2 of the template 100 in the X direction. In this case, the movable member 321 moves in the Y direction, that is, orthogonal, in a two-dimensional manner, to the X direction (refer to FIG. 9). Accordingly, once the movable member 321 moves from one end E1 of the template 100 to the other end E2 facing the one end E1 of the template 100, the liquid film 10 can be completely turned into the ice film 11.

The solidifying mechanism 213a provided in the second embodiment causes the heat absorber 31 to absorb the heat of the liquid film 10 to freeze the liquid film 10, for example. Accordingly, the solidifying mechanism 213a does not entail, for example, "convection" when the liquid film 10 freezes. Therefore, the solidifying mechanism 213a can further improve "cleanliness" in solidifying, for example, freezing of the liquid film 10.

For example, a filter is provided to ensure that unnecessary particles do not get into the substrate processing unit from the outside of the substrate processing unit when the cooled gas 305 is used, for example. However, the capacity of the filter to prevent the particles from getting in is limited. For this reason, it is not easy to completely block the particles.

When the cooled gas 305 is used, a flow of gas is generated in the substrate processing unit. There is a possibility that the flow of gas whirls minute particles in the substrate processing unit.

Under the circumstances, the solidifying mechanism 213a can solidify, for example, freeze the liquid film 10 without the cooled gas 305 being used. As a result, the following advantages can be obtained.

The particles can be prevented from getting into the substrate processing unit 208a from the outside of the substrate processing unit 208a, for example.

The possibility of the minute particles in the substrate processing unit being whirled is low, compared to a case where the cooled gas 305 is used.

Even if the cooled gas 305 is used, the "cleanliness" in freezing the liquid film 10, for example, is within an allowable range as it is. However, there may be a demand for even higher "cleanliness" in the future given that the semiconductor devices are becoming increasingly miniaturized.

For example, even if there is a demand for even higher "cleanliness", the demand can be met in the second embodiment. Accordingly, the exemplary embodiment is in a favorable position to better cope with a trend in which the semiconductor device becomes increasingly miniaturized.

First Modification Example

Figure 12:
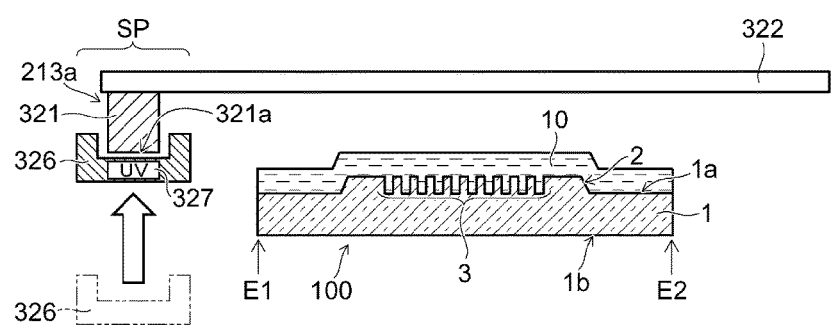
FIG. 12 is a schematic sectional view illustrating a first modification example of the second embodiment.

FIG. 12 is a schematic sectional view illustrating a first modification example of the second embodiment.

As illustrated in FIG. 12, the solidifying mechanism of the first modification example is different from the solidifying mechanism 213a illustrated in FIGS. 9 to 11 in that the solidifying mechanism of the first modification example further includes a cleaning mechanism 326 that cleans the movable member 321. The cleaning mechanism 326 is provided at a standby position SP, for example. The standby position SP is a position where the movable member 321 stands by. The cleaning mechanism 326 moves up and down at the standby position SP. The cleaning mechanism 326 is positioned much below the movable member 321 except during cleaning. During cleaning, the cleaning mechanism 326 rises such that the cleaning mechanism 326 nearly comes into contact with the movable member 321 or comes into contact with the movable member 321.

The cleaning mechanism 326 cleans the facing surface 321a of the movable member 321. The cleaning mechanism 326 is provided with, for example, a UV irradiation device 327. The UV irradiation device 327 emits ultraviolet rays onto the facing surface 321a to clean the facing surface 321a. If the UV irradiation device 327 is used, the facing surface 321a, for example, may be covered with a photocatalyst. The photocatalyst promotes the shedding of dirt when the photocatalyst receives ultraviolet rays. An example of the photocatalyst includes titanium oxide and tungsten oxide.

Since the cleaning mechanism 326 is provided in the first modification example, the facing surface 321a of the movable member 321 can be cleaned, if necessary. The facing surface 321a is cleaned before solidifying, for example, freezing the liquid film 10.

For example, if the liquid film 10 is frozen after the facing surface 321a is cleaned, the shedding of the particles from the facing surface 321a to the liquid film 10, for example, can be prevented. Accordingly, the cleanliness of the patterned surface 1a of the template 100 after cleaning can be further improved.

Second Modification Example

Figure 13:
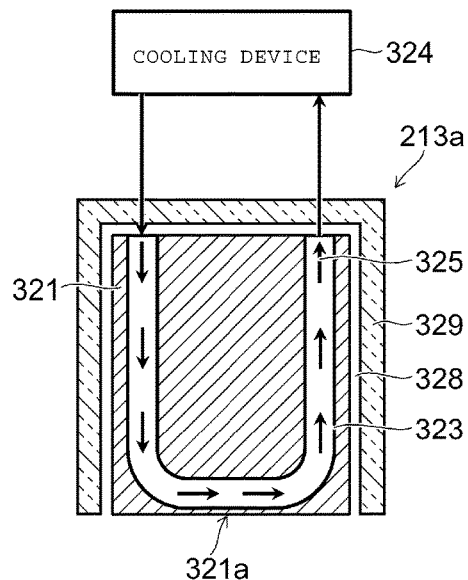
FIG. 13 is a schematic sectional view illustrating a second modification example of the second embodiment.

FIG. 13 is a schematic sectional view illustrating a second modification example of the second embodiment.

As illustrated in FIG. 13, the solidifying mechanism of the second modification example is different from the solidifying mechanism 213a illustrated in FIGS. 9 to 11 in that the solidifying mechanism of the second modification example further includes an insulator 329 that surrounds surfaces of the movable member 321, except for the facing surface 321a, via a space 328.

According to the second modification example, since the insulator 329 that surrounds the surfaces of the movable member 321, except for the facing surface 321a, is provided via the space 328, "condensation" on the movable member 321 can be prevented. If the "condensation" on the movable member 321 occurs, there is a possibility that particles or foreign substances larger than the particles are attached to the movable member 321. There is a possibility that the substances attached to the movable member 321 fall on the liquid film 10.

The substances can be prevented from being attached to the movable member 321 in the second modification example in which the condensation can be prevented. Accordingly, the cleanliness of the patterned surface 1a of the template 100 after cleaning can be further improved in the second modification example as well in which the substances are unlikely to be attached to the movable member 321.

The second modification example can be realized by being combined with the first modification example.

Third Modification Example

Figure 14:
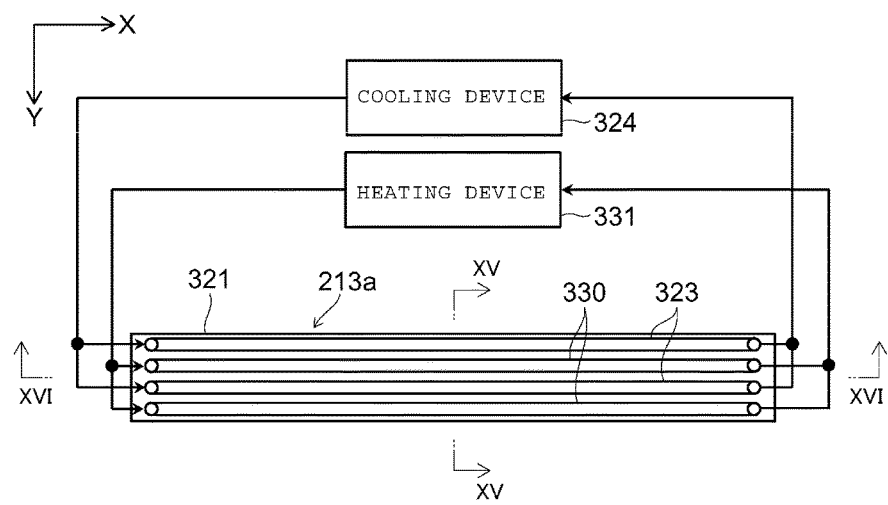
FIG. 14 is a schematic plan view illustrating a third modification example of the second embodiment.
Figure 15:
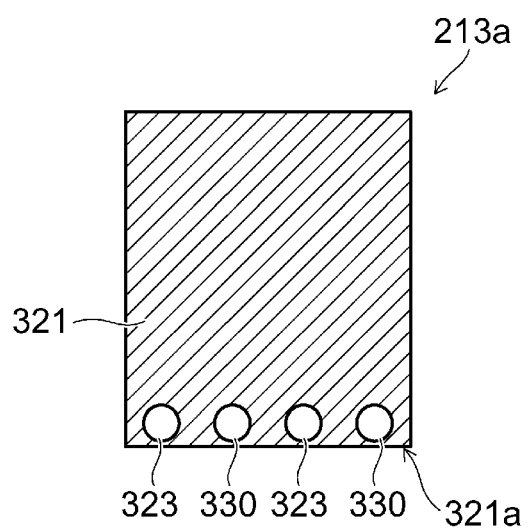
FIG. 15 is a schematic sectional view taken along line XV-XV in FIG. 14.
Figure 16A:
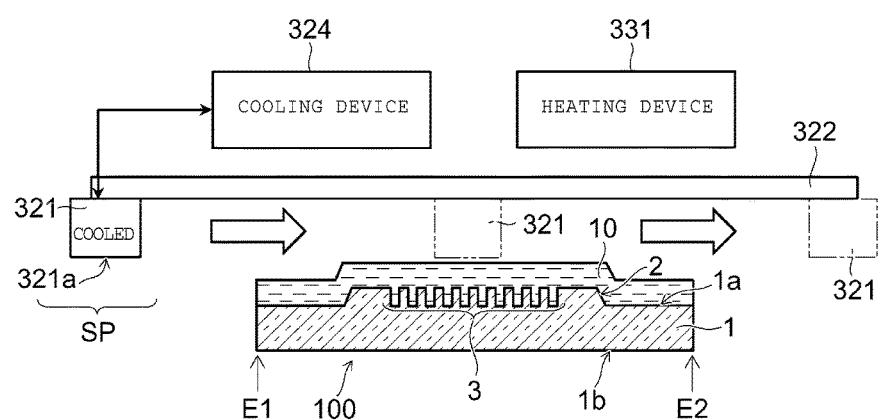
FIG. 16A and FIG. 16B are sectional views taken along line XVI-XVI in FIG. 14.
Figure 16B:
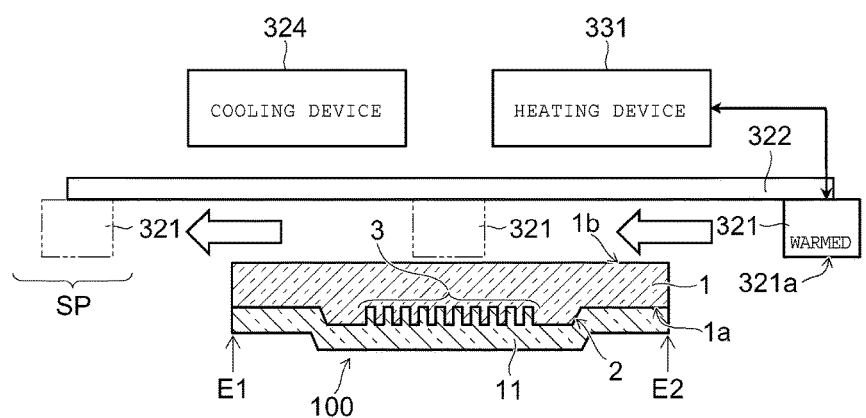

FIG. 14 is a schematic plan view illustrating a third modification example of the second embodiment. FIG. 15 is a schematic sectional view taken along line XV-XV in FIG. 14. FIG. 16A and FIG. 16B are sectional views taken along line XVI-XVI in FIG. 14.

As illustrated in FIGS. 14 to 16B, the solidifying mechanism of the third modification example is different from the solidifying mechanism 213a illustrated in FIGS. 9 to 11 in that the movable member 321 includes a heating tube 330 and a heating device 331 in addition to the cooling tube 323. The thawing mechanism 214 does not necessarily have to be provided in the third modification example. In the third modification example, the thawing mechanism 214 can be integrated into the movable member 321.

The heating tube 330 and the cooling tube 323 are, for example, alternately provided in the movable member 321. The heating tube 330 is connected to the heating device 331. A heated fluid flows in the heating tube 330. The heating device 331 heats the fluid flowing in the heating tube 330. The heated fluid, for example, circulates between the heating tube 330 and the heating device 331. The fluid flowing in the heating tube 330 may be a gas or may be a liquid.

In the third modification example, in the movable member 321, the cooling device 324 is turned "ON", and the heating device 331 is turned "OFF" during freezing, for example. The movable member 321 is cooled (refer to FIG. 16A). The movable member 321 moves via the one end E1 of the template 100 from the standby position SP toward a direction where the other end E2 exists. Accordingly, the liquid film 10 freezes.

During thawing, the cooling device 324 is turned "OFF", and the heating device 331 is turned "ON". The movable member 321 is warmed (refer to FIG. 16B). The movable member 321 moves to the standby position SP, via the other end E2 of the template 100 toward a direction where the one end E1 exists. Accordingly, the ice film 11 thaws.

Once the movable member 321 returns to the standby position SP, the movable member 321 may move from the standby position SP toward the direction where the other end E2 exists via the one end E1 of the template 100 during the thawing.

According to the third modification example, by the heating tube 330 being provided in the movable member 321, the ice film 11 can be thawed, for example, without "convection" being entailed as in the case of solidifying, for example, freezing the liquid film 10. As a result, the particles can be prevented from being attached to the template 100 when thawing compared to a case where the gas 306 is sprayed onto the template 100 when thawing. Accordingly, the cleanliness of the patterned surface 1a of the template 100 after cleaning can be further improved in the third modification example as well.

The third modification example can be realized by the first and the second modification examples being combined.

Fourth Modification Example

Figure 17:
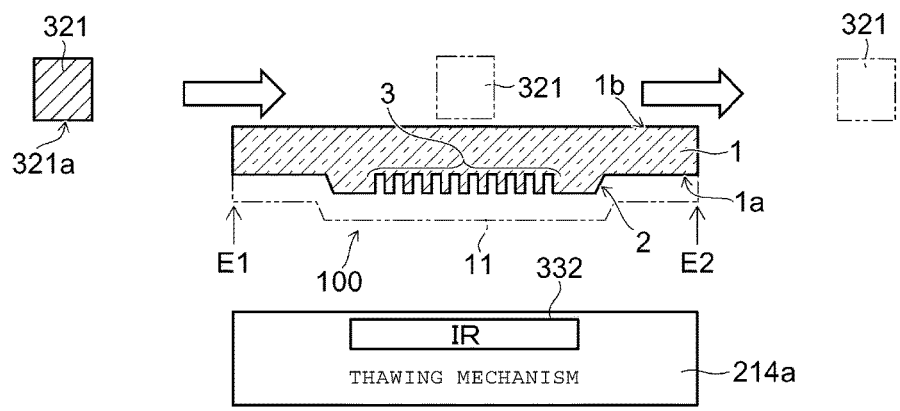
FIG. 17 is a schematic sectional view illustrating a fourth modification example of the second embodiment.

FIG. 17 is a schematic sectional view illustrating a fourth modification example of the second embodiment.

As illustrated in FIG. 17, the substrate processing unit of the fourth modification example is different from the substrate processing unit 208 illustrated in FIG. 9 toll in that an infrared lamp 332, for example, is included in a thawing mechanism 214a. The thawing mechanism 214a is provided, for example, below the holding mechanism (not illustrated) 210 that holds the template 100.

The thawing mechanism 214a thaws the ice film 11 by heat being transmitted by the infrared lamp 332 to the ice film 11 when thawing the ice film 11.

According to the fourth modification example, the ice film 11 can be thawed, for example, without "convection" being entailed as in the case of solidifying, for example, freezing the liquid film 10. As a result, as in the third modification example, the particles can be prevented from being attached to the template 100 when thawing compared to a case where the gas 306 of which a temperature is adjusted is sprayed onto the template 100. Accordingly, the cleanliness of the patterned surface 1a of the template 100 after cleaning can be further improved in the fourth modification example as well.

The fourth modification example can be realized by the first to the third modification examples being combined.

Fifth Modification Example

Figure 18:
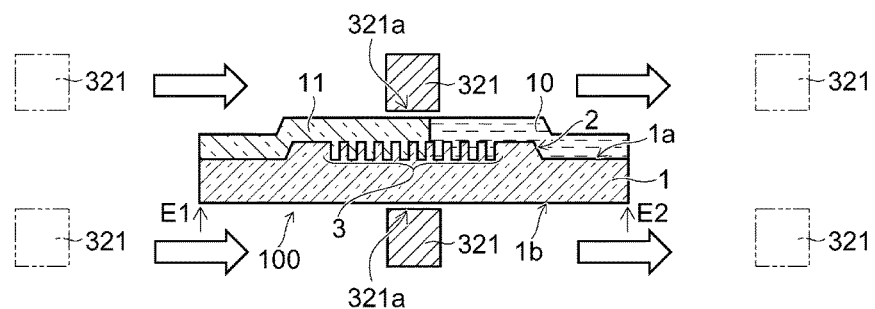
FIG. 18 is a schematic sectional view illustrating a fifth modification example of the second embodiment.

FIG. 18 is a schematic sectional view illustrating a fifth modification example of the second embodiment.

As illustrated in FIG. 18, the substrate processing unit of the fifth modification example is different from the substrate processing unit 208 illustrated in FIGS. 9 to 11 in that the movable members 321 are provided facing both major surfaces of the template 100 with the template 100 being interposed therebetween.

The number of the movable member 321 is not limited to one. A plurality of the movable members 321 can be provided. For example, if the two movable members 321 are provided facing both major surfaces of the template 100, a cooling effect can be improved compared to a case where one movable member is provided.

The fifth modification example can be realized by the first to the fourth modification examples being combined.

Sixth Modification Example

Figure 19:
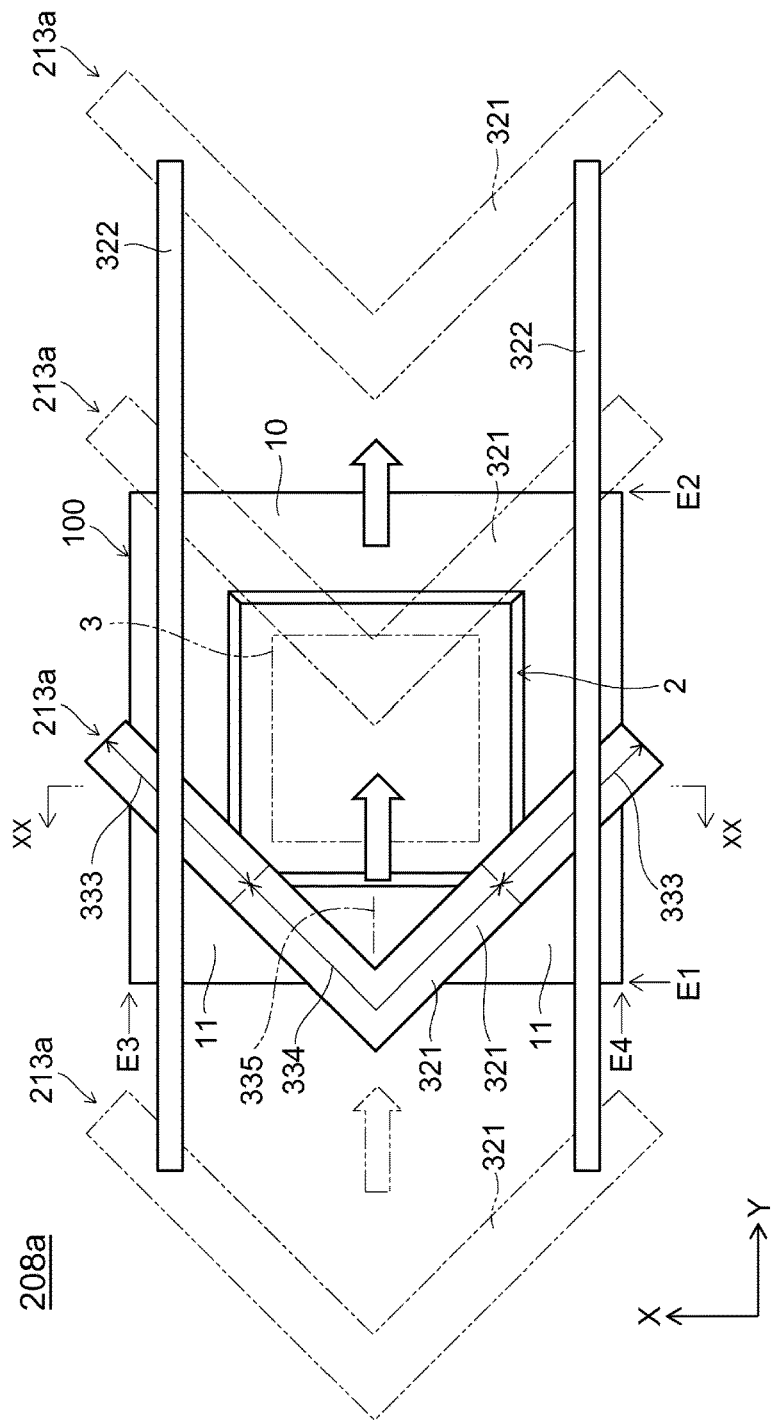
FIG. 19 is a schematic plan view illustrating a sixth modification example of the second embodiment.
Figure 20:
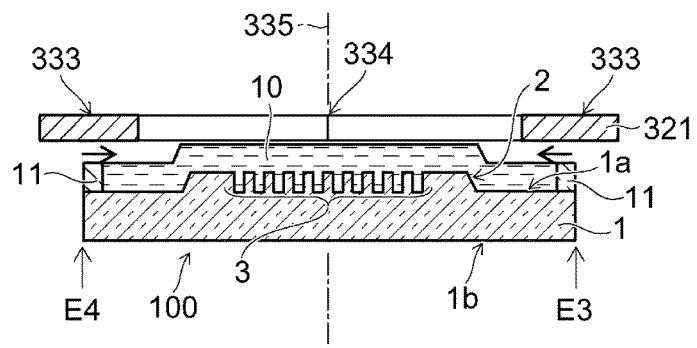
FIG. 20 is a schematic sectional view taken along line XX-XX in FIG. 19.

FIG. 19 is a schematic plan view illustrating a sixth modification example of the second embodiment. FIG. 20 is a schematic sectional view taken along line XX-XX in FIG. 19.

As illustrated in FIGS. 19 and 20, the substrate processing unit of the sixth modification example is different from the substrate processing unit 208 illustrated in FIGS. 9 to 11 in that planar surfaces of the movable member 321 are, for example, in a "V shape". If the planar surfaces of the movable member 321 are, for example, in a "V shape", a "difference in timing" at which the movable member 321 reaches the facing side of the template 100 can occur depending on which part of the area of the template the movable member 321 reaches.

For the convenience of description, the movable member 321 will be divided into two portions, that is, a first portion 333 and a second portion 334. Two tips that are at the ends of the "V shape" of the movable member 321 are the first portions 333, and a apportion having the corner part of the "V shape" of the movable member 321 is the second portion 334. When solidifying, for example, freezing, a proceeding direction of the movable member 321 is "E1→E2", and the leading ends of the movable member 321 in the proceeding direction are the first portions 333.

In this case, the first portions 333 reach the facing side of the template 100 first. The second portion 334 reaches the facing side of the template 100 later than the first portions 333. The first portions 333 freeze the liquid film 10 of the template 100 from two opposing side portions E3 and E4 in the proceeding direction of the movable member 321 toward the inside of the liquid film 10. The second portion 334 freezes the liquid film 10, later than the first portions 333, from the inside of the side portions E3 and E4 toward a center line 335 in the Y direction of the template 100.

If such a solidifying method of the liquid film 10 is used, the following advantages can be obtained.

Figure 21A:
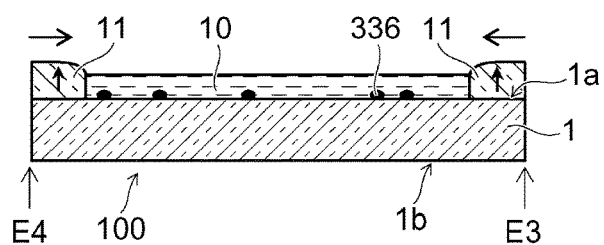
FIGS. 21A to 21C are schematic sectional views illustrating a principle of the sixth modification example.
Figure 21B:
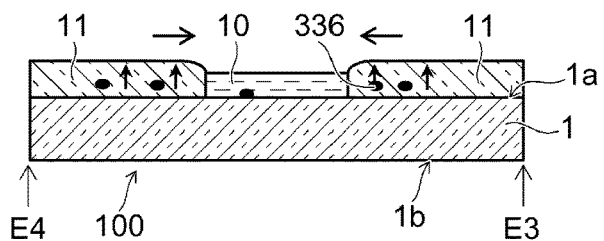
Figure 21C:
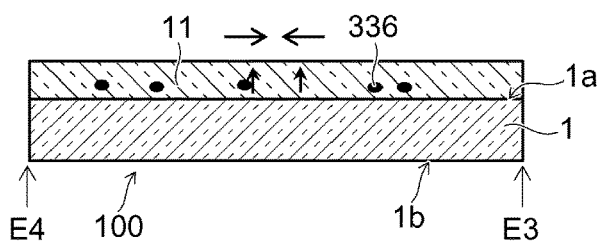

FIGS. 21A to 21C are schematic sectional views illustrating a principle of the sixth modification example.

The volume of the liquid film 10 expands when the liquid film 10 freezes, as illustrated in FIGS. 21A to 21C. For this reason, when freezing the liquid film 10, particles 336 on the patterned surface 1a are lifted, and the particles 336 are pulled away from the patterned surface 1a.

As described above, in the sixth modification example, the liquid film 10 gets solidified, for example, frozen from the two opposing side portions E3 and E4 of the template 100 toward the central portion of the template 100. Accordingly, the particles 336 can be pulled away from the patterned surface 1a. As a result, an effect of removing the particles 336 from the patterned surface 1a can be further improved.

As described above, the substrate production method, the substrate processing apparatus, and the substrate production system that enable the production of a substrate, for example, the template 100 of which the patterned surface 1a has a high cleanliness can be provided in the second embodiment as well.

The embodiments and the modification examples described herein have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

For example, in the embodiments, the template 100 used in the imprint lithography, for example, the nanoimprint lithography has been given as an example but the embodiment can be applied to the production of flat panel displays and solar panels.

What is claimed is:

1. A substrate production system comprising:
    a substrate processing unit that includes:
        a holding mechanism including a rotation stage and a holder which holds a substrate, the substrate having a patterned surface on an upper surface thereof, the holder spacing the substrate from the rotation stage to expose a back surface of the substrate, the back surface opposite the upper surface;
        a first supplying mechanism which supplies a liquid onto the patterned surface while the substrate is positioned on the holder to form a liquid film
        a second supplying mechanism which supplies a liquid to the patterned surface after the substrate is reversed;
        a movable solidifying mechanism which solidifies the liquid film on the patterned surface to form a solidified film; and
        a thawing mechanism which thaws the solidified film;
    a substrate reversing unit that includes a reversing mechanism which reverses the substrate;
    a substrate transporting unit that transfers the substrate between the substrate processing unit and the substrate reversing unit; and
    a controller configured to:
        control the first supplying mechanism to form the liquid film onto the patterned surface and control the movable solidifying mechanism to solidify the liquid film in the substrate processing unit;
        after the liquid film is solidified, control the substrate transporting unit to transfer the substrate to the substrate reversing unit to reverse the substrate, and transfer the reversed substrate back to the substrate processing unit; and
        simultaneously control the thawing mechanism to thaw the solidified film and the second supplying mechanism to supply the liquid to rinse the patterned surface of the substrate.

2. The system of claim 1, wherein the movable solidifying mechanism having a heat absorbing surface that extends in a first direction, faces the upper surface of the substrate, and moves across the upper surface of the substrate to absorb heat from the upper surface of the substrate and solidify a liquid film formed on the patterned surface.

3. The system of claim 2, wherein a heat absorber for the movable solidifying mechanism and a heating device for the thawing mechanism are included in a movable member.

4. The system of claim 3, further comprising a moving mechanism that moves the movable member above the holding mechanism.

5. The system of claim 1, further comprising a cylindrical treatment cup housing the holding mechanism.

6. The system of claim 5, wherein the thawing mechanism is positioned outside the cylindrical treatment cup.

7. The system of claim 5, wherein the movable solidifying mechanism is positioned outside the cylindrical treatment cup.

8. The system of claim 7, wherein the second supplying mechanism is positioned within the cylindrical treatment cup.

9. The system of claim 5, wherein the substrate production system further comprises a loading and unloading unit arranged along the substrate transporting unit on a side opposite the substrate reversing unit.

10. The system of claim 5, wherein the substrate reversing mechanism includes opposing supporting mechanisms supporting opposite sides of the substrate.

11. The system of claim 5, wherein the movable solidifying mechanism further comprises a cleaning mechanism, the cleaning mechanism comprising a UV radiation device.

12. The system of claim 5, wherein the thawing mechanism includes an infrared lamp.

13. The substrate production system of claim 1, wherein the first supplying mechanism is provided on an opposite side of the second supplying mechanism with respect to the substrate positioned on the holder.

14. The substrate production system of claim 1, wherein the second supplying mechanism is provided on a side of the rotation stage with respect to the substrate.

15. The substrate production system according to claim 1, wherein the second supplying mechanism is arranged outside the substrate processing unit below the rotation stage.

16. A substrate production system comprising:
a substrate processing unit that includes:
a holding mechanism including a rotation stage and a holder which holds a substrate, the substrate having a patterned surface on an upper surface thereof, the holder spacing the substrate from the rotation stage to expose a back surface of the substrate, the back surface opposite the upper surface;
a cylindrical treatment cup housing the holding mechanism;
a first supplying mechanism which supplies a liquid onto the patterned surface while the substrate is positioned on the holder to form a liquid film
a second supplying mechanism which supplies a liquid to the patterned surface after the substrate is reversed, the second supplying mechanism positioned within the cylindrical treatment cup;
a movable solidifying mechanism which solidifies the liquid film on the patterned surface to form a solidified film; and
a thawing mechanism which thaws the solidified film, the thawing mechanism positioned outside the cylindrical treatment cup;
a substrate reversing unit that includes a reversing mechanism which reverses the substrate;
a substrate transporting unit that transfers the substrate between the substrate processing unit and the substrate reversing unit; and
a controller configured to:
control the first supplying mechanism to form the liquid film onto the patterned surface and control the movable solidifying mechanism to solidify the liquid film in the substrate processing unit;
after the liquid film is solidified, control the substrate transporting unit to transfer the substrate to the substrate reversing unit to reverse the substrate, and transfer the reversed substrate back to the substrate processing unit; and
simultaneously control the thawing mechanism to thaw the solidified film and the second supplying mechanism to supply the liquid to rinse the patterned surface of the substrate.

17. The system of claim 16, wherein the substrate production system further comprises a loading and unloading unit arranged along the substrate transporting unit on a side opposite the substrate reversing unit.

18. The system of claim 17, wherein the substrate reversing mechanism includes opposing supporting mechanisms supporting opposite sides of the substrate.

19. The system of claim 18, wherein the movable solidifying mechanism further comprises a cleaning mechanism, the cleaning mechanism comprising a UV radiation device.

20. The system of claim 19, wherein the thawing mechanism includes an infrared lamp.

21. A substrate production system comprising:
a substrate processing unit that includes:
a holding mechanism including a rotation stage and a holder which holds a substrate, the substrate having a patterned surface on an upper surface thereof, the holder spacing the substrate from the rotation stage to expose a back surface of the substrate, the back surface opposite the upper surface;
a first supplying mechanism which supplies a liquid onto the patterned surface while the substrate is positioned on the holder to form a liquid film
a second supplying mechanism which supplies a liquid to the patterned surface after the substrate is reversed;
a movable solidifying mechanism which solidifies the liquid film on the patterned surface to form a solidified film; and
a thawing mechanism which thaws the solidified film;
a substrate reversing unit that includes a reversing mechanism which reverses the substrate;
a substrate transporting unit that transfers the substrate between the substrate processing unit and the substrate reversing unit; and
a controller configured to:
control the first supplying mechanism to form the liquid film onto the patterned surface and control the movable solidifying mechanism to solidify the liquid film in the substrate processing unit;
after the liquid film is solidified, control the substrate transporting unit to transfer the substrate to the substrate reversing unit to reverse the substrate, and transfer the reversed substrate back to the substrate processing unit such that the solidified film does now thaw; and
simultaneously control the thawing mechanism to thaw the solidified film and the second supplying mechanism to supply the liquid to rinse the patterned surface of the substrate.

\* \* \* \* \*